(12) United States Patent
Aoyama

(10) Patent No.: US 7,306,882 B2
(45) Date of Patent: Dec. 11, 2007

(54) PHASE SHIFT MASK INCLUDING A SUBSTRATE WITH RECESS

(75) Inventor: Satoshi Aoyama, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 382 days.

(21) Appl. No.: 11/133,233

(22) Filed: May 20, 2005

(65) Prior Publication Data

US 2005/0260506 A1 Nov. 24, 2005

(30) Foreign Application Priority Data

May 21, 2004 (JP) ............................. 2004-151956
Apr. 1, 2005 (JP) ............................. 2005-106163

(51) Int. Cl.
*G03F 1/00* (2006.01)

(52) U.S. Cl. ........................................ 430/5

(58) Field of Classification Search .................... 430/5, 430/30, 322–324, 394
See application file for complete search history.

(56) References Cited

U.S. PATENT DOCUMENTS

2005/0058915 A1* 3/2005 Uematsu ........................ 430/5

FOREIGN PATENT DOCUMENTS

JP 2003-344987 12/2003

* cited by examiner

*Primary Examiner*—S. Rosasco
(74) *Attorney, Agent, or Firm*—McDermott Will & Emery LLP

(57) ABSTRACT

A phase shift mask includes a quartz substrate having a main surface partially dug, and a Cr film deposited on the main surface. The dug portion includes an undercut provided such that the Cr film partially serves as an eaves, and the Cr film has a π opening exposing a portion of the dug portion, and a first subopening exposing an end of the dug portion.

16 Claims, 8 Drawing Sheets

PHASE SHIFT MASK INCLUDING A SUBSTRATE WITH RECESS

BACKGROUND OF THE INVENTION

1. Field of the Invention

The present invention relates to phase shift mask.

2. Description of the Background Art

When a semiconductor device is fabricated in a process, photoresist patterns and the like are formed in a large number of photolithography steps performing exposure through masks. For example, a photoreceptive circuit substrate is provided with a circuit diagram through exposure and then chemically processed to produce an integrated printed wired circuit.

In photolithography, it is preferable that fine patterns can be provided through exposure. Photolithography has its limit depending on the wavelength of light used to perform exposure. The limit can be reduced by phase shifting employing a Levenson mask. More specifically, a mask provided with a pattern to be transferred has a portion that shifts light's phase, or a shifter. Light having passed through the shifter and thus having its phase sifted and light that does not pass through the shifter and thus has its phase unshifted mutually interfere, which is utilized to provide increased resolution. The Levenson mask includes that having a shifter layer provided on the substrate's surface as well as that having as a shifter a portion dug into the substrate's main surface.

If a dug portion is provided with a Levenson mask, then the substrate's main surface that transmits light serves as a 0 portion that does not shift the light's phase and the dug portion serves as a π portion that shift the light's phase. The π portion is dug to a depth allowing a phase to be offset by one half of the wavelength.

The substrate's dug or π portion has a sidewall, which has an effect so that a dimension that is transmitted through the dug portion, and thus transferred is smaller than desired. To eliminate this effect, the dug portion is formed to be larger than an opening of a shielding film deposited on a surface of the Levenson mask. More specifically, if the shielding film has the opening surrounded by an eaves, the 0 and π portions transfer a dimension with reduced difference (i.e., the 0 portion's transferred dimension minus the π portion's transferred dimension is reduced). In contrast, if the eaves is excessively large, the shielding film can peel off and thus provide an accordingly changed geometry for projection, which can fatally damage a circuit that is formed. Accordingly there is a demand for forming an eaves having a size with precision.

The Levenson mask having a shielding film with an opening surrounded by an eaves can be formed by dry etching to form a dug portion in a rectangle as seen in cross section, and subsequently wet etching to increase the dug portion in size. More specifically, the wet etching can provide the shielding film with the eaves and provide the dug portion with an undercut. The eaves's size can be estimated from the wet etching's time. Alternatively, it can be measured with an atomic force microscope or similar contact-type equipment.

Furthermore, Japanese Patent Laying-Open No. 2003-344987 discloses a method of measuring a size of an eaves of a phase shift mask, including the steps of: forming on a substrate a light shielding pattern and a monitoring pattern dimensioned as prescribed; etching the substrate with the monitoring and light shielding patterns, as prescribed, to provide the substrate with a step; and removing the monitoring pattern from the stepped substrate and measuring, as a size of an eaves, a dimension of a plane of the substrate at a particular region located directly under the monitor pattern and defined by the step.

If the Levenson mask's eaves is measured by estimating its size from the wet etching's time, as described above, a large error is introduced between the eaves's actual and estimated sizes, and whether the eaves has a size as desired can also not directly be confirmed. Furthermore, if it is measured with contact-type equipment, a probe is used to trace a surface of a substance and a dug portion inside that provided with the eaves can hardly be measured accurately.

Thus in conventional art the Levenson mask's eaves cannot directly be measured accurately and whether the eaves's size has a desired value can only be determined by employing a completed Levenson mask for transfer and confirming a result thereof.

The Levenson mask disclosed in Japanese Patent Laying-Open No. 2003-344987 requires providing the substrate's main surface with a light shielding pattern as well as a monitoring pattern and, furthermore, subsequently removing the monitoring pattern alone, resulting in an increased number of steps to produce the Levenson mask.

SUMMARY OF THE INVENTION

The present invention contemplates a phase shift mask allowing an eaves to be directly, accurately measured in size.

The present phase shift mask includes a substrate having a main surface partially recessed, and a light shielding film deposited on the main surface. The recess includes an undercut provided such that the light shielding film partially serves as an eaves, and the light shielding film has a first main opening exposing a portion of the recess, a second main opening exposing a main surface of the substrate, and a first subopening exposing an end of the recess underlying the first main opening. The recess has the end formed to be geometrically substantially similar to the first main opening. The first main opening is located within a region provided with the recess. First light, having passed through the first main opening ,and second light, having passed through the second main opening are shifted in wavelength substantially by one half.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

With reference to FIGS. 1-4 the present invention in a first embodiment provides a Levenson mask and a method of fabricating a semiconductor device, as will be described hereinafter.

Figure 1:
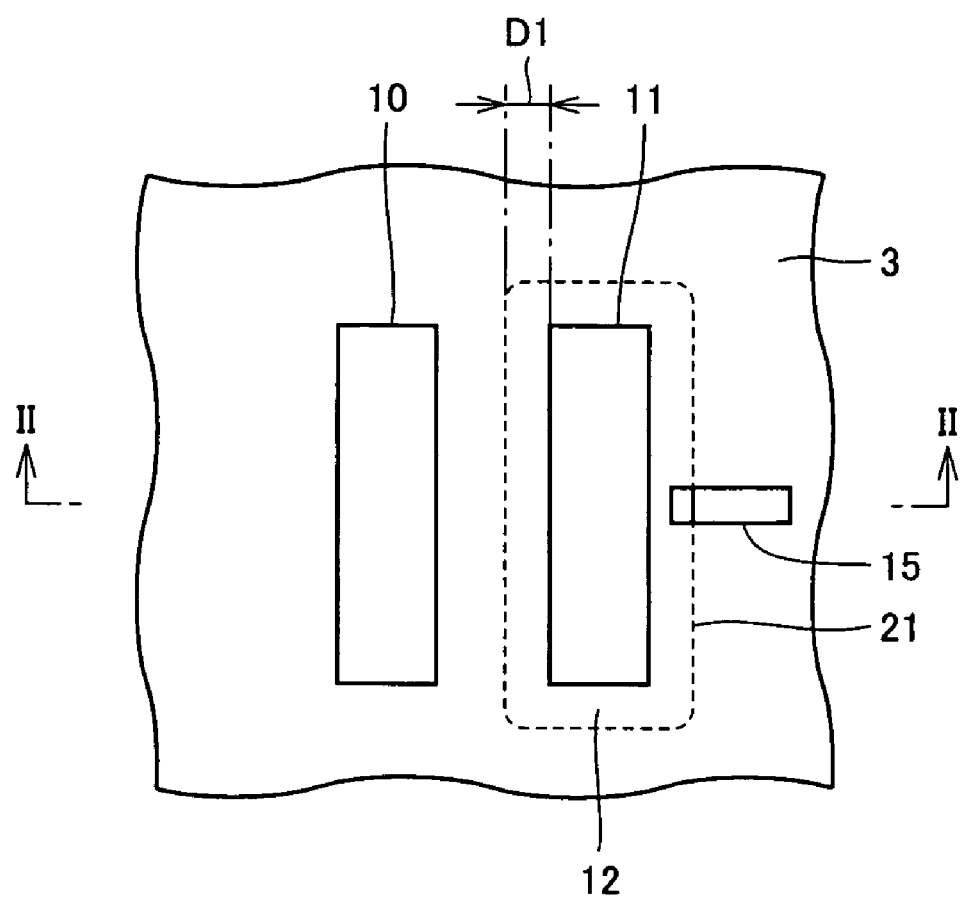
FIGS. 1 and 2 are a plan view and a cross section, respectively, of a Levenson mask in a first embodiment.
Figure 2:
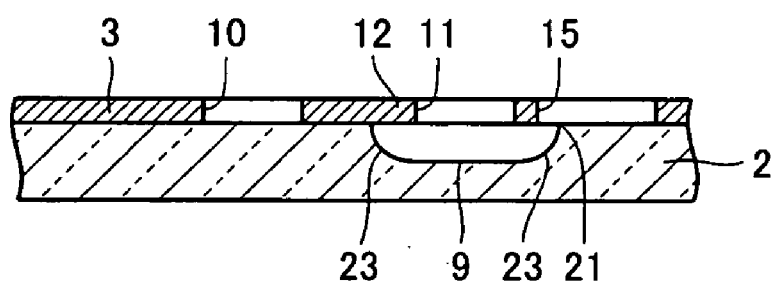

FIG. 1 is a plan view of Levenson mask in the present embodiment and FIG. 2 is a cross section thereof taken along a line II-II in FIG. 1. FIG. 1 shows a pattern, which is provided as a monitoring mark for measuring a size of an eaves. The present embodiment's the phase shift mask implemented by Levenson mask includes a quartz (Qz) substrate 2, and a Cr film 3 deposited on a main surface of quartz substrate 2 to serve as a shielding film. Quartz substrate 2 has a main surface partially dug 9 to have a recess.

Cr film 3 has an opening to allow exposure to be performed in a desired geometry. The opening includes a first main opening implemented by a π opening exposing a surface of the dug portion, and a second main opening implemented by a 0 opening exposing a main surface of quartz substrate 2. The 0 and π openings penetrate Cr film 3.

The present embodiment's Levenson mask has a 0 opening 10 and a π opening 11 each formed in a rectangle having a longitudinal direction as seen in a plane. In the present embodiment the π opening and the 0 opening are spaced by at most approximately 500 nm.

Dug portion 9 as seen in cross section is a rectangle having sides of which two opposite sides are formed in arc. Dug portion 9 has a flat bottom surface and a curved side surface. Dug portion 9 is formed to be larger than π opening 11. More specifically, dug portion 9 is formed directly under Cr film 3 such that quartz substrate 2 is partially gouged. Dug portion 9 has an end 21 in contact with Cr film 3. Cr film 3 provides an eaves 12 along π opening 11 to shade a part of dug portion 9.

In the present invention a region of dug portion 9 that is defined when eaves 12 is projected on dug portions 9 is referred to as an "undercut". Dug portion 9 has a periphery with an undercut 23 provided along π opening 11.

The eaves has a size (i.e., a dimension as seen widthwise), which is optimal depending on the wavelength of light employed to perform exposure. For example, if KrF excimer laser (wavelength: 248 nm) is employed, the eaves is preferably formed to have a size of approximately 150 nm. If ArF excimer laser (wavelength: 193 nm) is employed, the eaves is preferably formed to have a size of approximately 100 nm.

The present embodiment's Levenson mask includes a first subopening 15 adjacent to π opening 11 and penetrating Cr film 3. The first subopening 15 is formed in a rectangle as seen in a plane and is located adjacent to a side of π opening 11. The first subopening 15 is located opposite to 0 Opening 10 relative to π opening 11. In the present embodiment π opening 11 in the rectangle as seen in a plane and the first subopening 15 have their respective longer sides extending substantially perpendicular to each other. The first subopening 15 has a longitudinal direction perpendicular to end 21 of dug portion 9.

With reference to FIG. 1, the first subopening 15 is defined to expose a portion of end 21 of dug portion 9 formed to correspond to π opening 11. Dug portion 9 has end 21 formed to be substantially geometrically similar to π opening 11. π opening 11 is provided to be included in a region provided with dug portion 9. More specifically, π opening 11 is arranged within a region surrounded by end 21 as seen in a plane.

Figure 3:
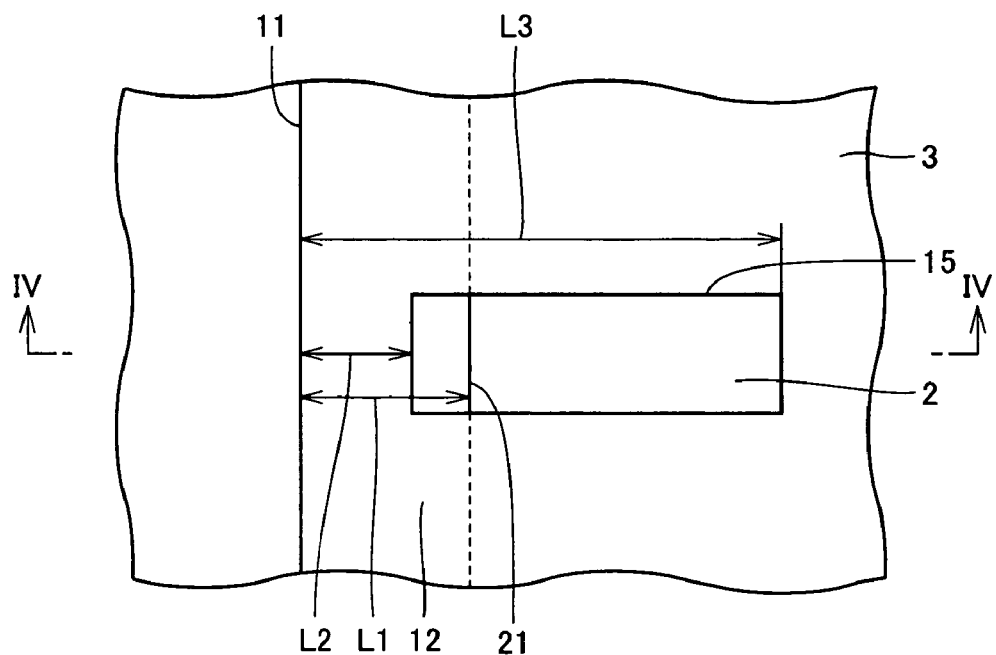
FIGS. 3 and 4 are an enlargement of a plan view and a cross section, respectively, of the Levenson mask in the first embodiment.
Figure 4:
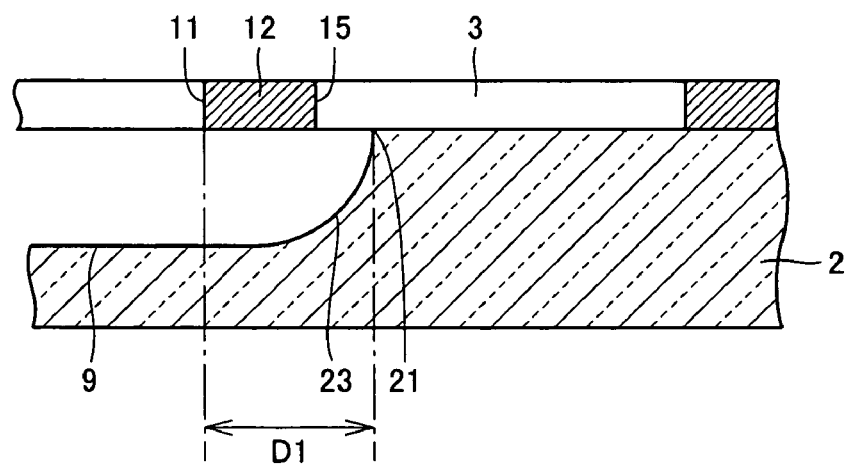

FIG. 3 is an enlarged plan view of one end of the first subopening 15. FIG. 4 is a cross section taken along a line IV-IV in FIG. 3. Dug portion 9 is formed to have a side surface extending as it approaches a surface of quartz substrate 2. The first subopening 15 is formed to show therethrough a portion of dug portion 9 and a portion of the main surface of quartz substrate 2 when the Levenson mask is seen directly from above. The first subopening 15 is formed to correspond to one straight end 21 of dug portion 9. The first subopening 15 is defined to have a portion in a region of eaves 12. Eaves 12 and undercut 23 are dimensioned in width to allow the eaves to have a size D1.

With reference to FIG. 3 in the present embodiment π opening 11 has a side in a straight line. The present embodiment's Levenson mask is formed to have this side substantially parallel to end 21 of dug portion 9 exposed through the first subopening 15. Furthermore the side and end 21 exposed through the first subopening 15 are spaced by a distance L1, which is larger than a distance L2 between the side and that end of the first subopening 15 closer to π opening 11 and is also smaller than a distance L3 between the side and that end of the first subopening 15 farther from π opening 11.

In the present embodiment the first subopening 15 is separated from π opening 11. Alternatively, the first subopening 15 may be formed in communication with π opening 11. In that case, distance L2 is 0. Furthermore in the present embodiment π opening 11 and the first subopening 15 may be provided outer than an exposure region used to form a pattern on a surface of a wafer.

In the present embodiment a semiconductor device is fabricated in a method employing the above described Levenson mask. For example, it is used to pattern an oxide film deposited on a main surface of a semiconductor substrate. In this method photoresist is applied on a main surface of the oxide film and the present embodiment's Levenson mask is used as a reticle to project a circuit pattern and thus expose a portion to light. Subsequently the exposed portion's photoresist is solved with a solution by immersing the semiconductor substrate therein to perform development to provide resist having the circuit pattern. The resist is then used as a pattern mask for etching to form the oxide film in a desired geometry.

In addition to the above, the present Levenson mask can be used to fabricate a metal oxide semiconductor (MOS) transistor, a hole to form a hole electrode, a logic circuit, and the like. For example, the present Levenson mask can be used to fabricate dynamic random access memory (DRAM), static random access memory (SRAM), flash memory, and other similar semiconductor memory.

In the present embodiment's Levenson mask the Cr film shields light effecting exposure and the 0 and π openings transmit light. First light, having passed through the π opening has its phase shifted by half the wavelength (or π), whereas second light, having passed through the 0 opening has its phase unshifted and is thus simply transmitted. As such, in a region of an object exposed to light that is located between a region exposed to light passing through the 0 opening and that exposed to light passing through the π opening, the lights experience optical interference and lights spreading thereacross are mutually cancelled. This allows precise exposure of the 0 and π openings' geometries to light and hence increased resolution. Furthermore, the dug portion provided with an undercut allows a dimension to be transferred with reduced difference.

The present embodiment's Levenson mask includes a Cr film provided with a first subopening to expose an end of a dug portion. When the Levenson mask is seen in a plane the dug portion's end can directly be observed. This allows a scanning electron microscope (SEM) or the like to be used to directly measure an eaves's size D1. More specifically, by measuring a distance between the π opening and an end that can be observed through the first subopening, size D1 can directly be measured.

This can eliminate the necessity of performing exposure to confirm that an eaves has a size as desired in dimension and a Levenson mask having an eaves with high precision can be provided. The eaves having a size with high precision allows high quality exposure.

If the eaves has size D1 different than desired, then the dug portion can be formed with an undercut by dry etching by a different amount and the dug portion can be provided with an undercut by wet etching by a different amount to form a Levenson mask as desired.

In the present embodiment a semiconductor device is fabricated by employing the above described Levenson mask. The present embodiment's Levenson mask allows a high quality exposure and a high quality semiconductor device can thus be fabricated. Furthermore, it also allows increased resolution and the semiconductor device can finely be fabricated. For example in a step of forming a gate electrode portion of an MOS transistor or that of forming a hole electrode, a fine pattern smaller than a wavelength of light for exposure can be formed with precision.

The present embodiment employs a quartz substrate. Alternatively, any substrate may be used that is transparent to light effecting exposure. For example, the quartz substrate may be replaced with a glass substrate. Furthermore, the present embodiment employs a shielding film formed of Cr. Alternatively, any film may be used that can shield light effecting exposure. For example, the Cr film may be replaced with a MoSi or similar metal film that is vapor-deposited.

The present embodiment employs a π opening formed in a rectangle as seen in a plane. Alternatively, it may have any geometry. Furthermore, the present embodiment employs a first subopening formed in a rectangle as seen in a plane. Alternatively, it may have any geometry. Furthermore the first subopening may be located at any position that can expose an end of a recess formed in the substrate. In the present embodiment the first subopening is formed to be a hole penetrating the shielding film. Alternatively, the π portion may partially be notched. In other words, the first subopening may be in communication with the π opening.

Furthermore in the present embodiment in addition to the π it opening a 0 opening is also provided. The 0 opening may, however, not be provided as it is provided as a monitoring mark having the first subopening in the present embodiment. Furthermore, the first subopening may be arranged in a region for exposing a semiconductor wafer to light at any position that does not affect the fabrication of the device.

Second Embodiment

Figure 5:
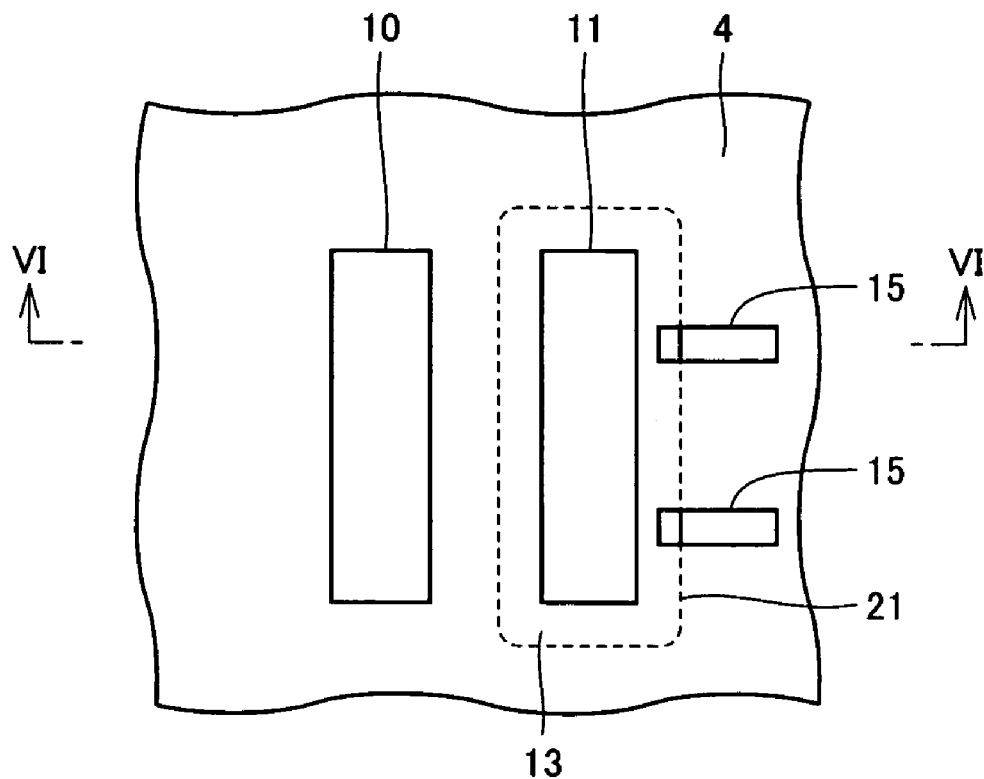
FIGS. 5 and 6 are a plan view and a cross section, respectively, of a Levenson mask in a second embodiment.
Figure 6:
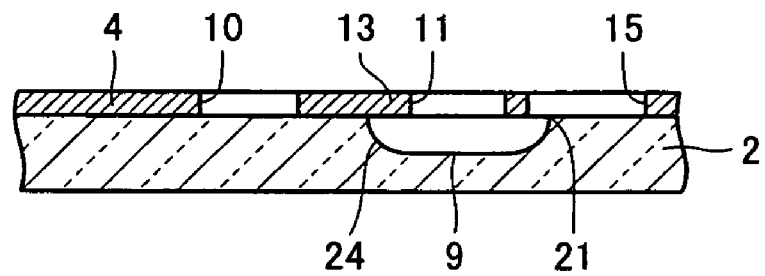

With reference to FIGS. 5 and 6 the present invention in a second embodiment provides a Levenson mask and a method of fabricating a semiconductor device, as will be described hereinafter.

FIG. 5 is a plan view of the Levenson mask in the present embodiment and FIG. 6 is a cross section thereof taken along a line VI-VI in FIG. 5. Quartz substrate 2 has a main surface with a Cr film 4 deposited thereon and having 0 and π openings 10 and 11 therein, similarly as has been described for the Levenson mask in the first embodiment. Furthermore, dug portion 9 has an undercut 24 directly under a perimeter of π opening 11, as has also been described for the Levenson mask in the first embodiment.

In the present embodiment's Levenson mask Cr film 4 has a plurality of first subopenings 15. In the present embodiment two first subopenings 15 are provided adjacent to a longer side of π opening 11 formed in a rectangle as seen in a plane. Each first subopening 15 has a longitudinal direction perpendicular to end 21 of dug portion 9. The two first subopenings 15 are mutually spaced. In the present embodiment the plurality of first subopenings 15 are provided for one straight end 21 of dug portion 9. The first subopening 15 as seen in a plane allows the dug portion 9 end 21 to be observed therethrough. The first subopening 15 has a portion within the region of an eaves 13.

In the present embodiment a semiconductor device is fabricated in a method employing the above described Levenson mask. The remainder in configuration and of the method of fabricating the semiconductor device is similar to that described in the first embodiment.

The present embodiment provides a Levenson mask having a plurality of first subopenings 15. This allows the eaves's size to be measured at a plurality of locations, and a Levenson mask allowing the size to be measured with higher precision can thus be provided.

Furthermore, the plurality of first subopenings 15 provided for straight end 21 of dug portion 9 allows a virtual straight line connecting ends 21 together to be obtained when the Levenson mask is seen in a plan view. By measuring a distance between this straight line and a linear portion of π opening 11, the eaves's size can be measured with higher precision.

In the present embodiment a semiconductor device can be fabricated in a method employing the above described Levenson mask. Higher precision exposure can be performed and hence a high quality semiconductor device can be provided. Furthermore, the exposure's revolution can be increased and a more precise semiconductor device can thus be provided.

The other function and effect are similar to those described in the first embodiment.

Third Embodiment

Figure 7:
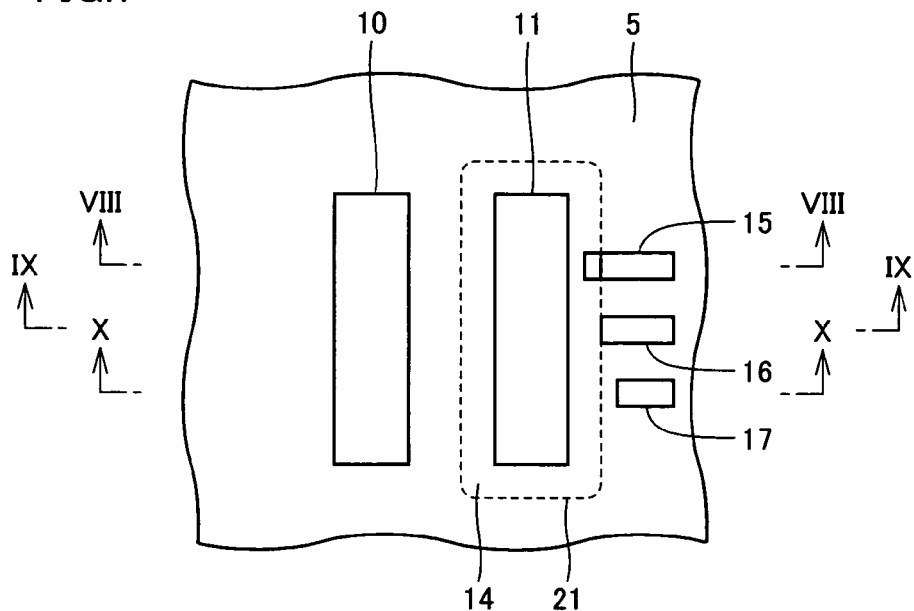
FIG. 7 is a plan view of a Levenson mask in a third embodiment.
Figure 8:
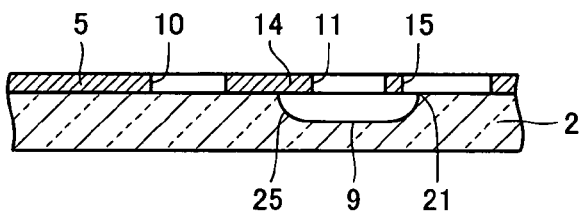
FIGS. 8, 9 and 10 are first, second and third cross sections, respectively, of the Levenson mask in the third embodiment.
Figure 9:
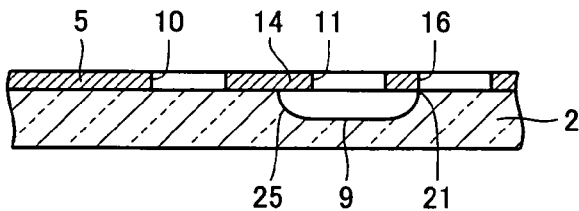
Figure 10:
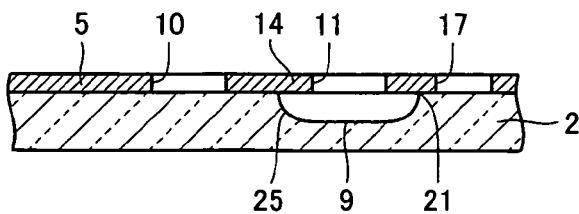

With reference to FIGS. 7-10 the present invention in a third embodiment provides a Levenson mask and a method of fabricating a semiconductor device, as will be described hereinafter. FIG. 7 is a plan view of the Levenson mask in the present embodiment. FIG. 8 is a cross section taken along a line VIII-VIII in FIG. 7. FIG. 9 is a cross section taken along a line IX-IX in FIG. 7. FIG. 10 is a cross section taken along a line X-X in FIG. 7.

Quartz substrate 2 has a surface with a Cr film 5 deposited thereon and having 0 and π openings 10 and 11 therein, similarly as has been described for the Levenson mask in the first embodiment. Furthermore, quartz substrate 2 has dug portion 9 with an undercut 25, as has also been described for the Levenson mask in the first embodiment.

In the present embodiment's Levenson mask Cr film 5 has the first subopening 15 and second subopenings 16, 17 each in a rectangle as seen in a plane. The first subopening 15 formed in a rectangle as seen in a plane extends in a direction substantially perpendicular to end 21 of dug portion 9. The first subopening 15 as seen in a plan view exposes end 21 therethrough. The first subopening 15 has a portion within the region of an eaves 14.

The second subopenings 16, 17 each formed in a rectangle as seen in a plane extend in a direction substantially parallel to that in which the first subopening 15 extends. The second subopening 16, 17 is provided in the form of a hole penetrating Cr film 5.

The first subopening 15 and the second subopenings 16, 17 are arranged to align in a direction in which a linearly extending one of end 21 of dug portion 9 extends. The first subopening 15 and the second subopenings 16, 17 are arranged to align along one side of π opening 11.

The second subopenings 16, 17 are defined to be gradually shorter in length than the first subopening 15, as seen in a direction perpendicular to that in which the dug portion 9 end 21 extends. In FIG. 7, as seen in that direction, the first subopening 15 is the longest, followed by the second subopening 16 and the second subopening 17.

Furthermore, when the second subopenings 16, 17 are seen in the direction in which end 21 extends, the second subopenings 16, 17 are defined to be gradually farther away from π opening 11 than the first subopening 15 in the direction perpendicular to that in which end 21 extends. The second subopenings 16, 17 are defined such that their respective ends closer to π opening 11 are gradually offset. In the present embodiment the first subopening 15 and the second subopening 16 have their respective ends offset by 10 nm, and so do the second subopenings 16 and 17. In other words, the first subopening 15 and the second subopenings 16, 17 have their respective adjacent ends each equally offset by an amount.

As shown in FIG. 9, the second subopening 16 has an end overlapping end 21 of dug portion 9. As shown in FIG. 10, the second subopening 17 is spaced from dug portion 9 and positioned to avoid eaves 14.

In the present embodiment a semiconductor device is fabricated in a method employing the above described Levenson mask. The remainder in configuration is similar to that described in the first embodiment.

The present embodiment provides a Levenson mask including a first subopening and second subopenings gradually farther away from a π opening than the first subopening in a direction perpendicularly across an end of a recess. The Levenson mask can be observed in a plan view to measure an eaves in size by the precision of a dimension offsetting the first and second subopenings' ends. The eaves's size can be measured from whether each subopening allows the recess's end to be observed.

In the present embodiment the first and second subopenings are each offset by 10 nm, and the eaves's size can be measured with a precision of 10 nm.

Thus the present embodiment provides a Levenson mask that can be observed in a plane view to measure an eaves in size. For example, while wet etching is performed, the first and second subopenings can be observed to measure the eaves's size.

In the present embodiment the first and second subopenings have their respective adjacent ends each offset by 10 nm. Alternatively, the second opening end may be spaced by a smaller interval (e.g., a pitch of 1 nm). The first and second subopening ends arranged at smaller intervals allow the eaves's size to be measured with higher precision.

Furthermore in the present embodiment the first subopening 15 has an end closest to π opening 11, and the second subopenings 16 and 17 have their respective ends gradually farther and still farther, respectively, away than the first subopening 15 from π opening 11. Alternatively, the second subopening may be defined to be distant from the π opening in any order.

The remainder in configuration, and function and effect is similar to that described in the first embodiment.

Fourth Embodiment

Figure 11:
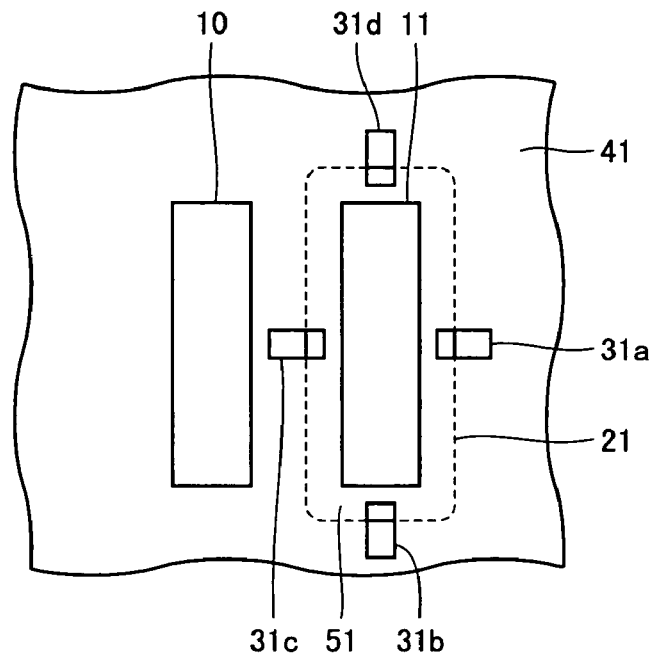
FIG. 11 is a plan view of a Levenson mask in a fourth embodiment.

With reference to FIG. 11, the present invention in a fourth embodiment provides a Levenson mask, as will be described hereinafter. FIG. 11 is a plan view of the Levenson mask in the present embodiment.

In the present embodiment a quartz substrate has a surface with a light shielding film implemented by a Cr film 41 deposited thereon. Cr film 41 has 0 opening 10 and π opening 11. The quartz substrate has a dug portion provided with an undercut, similarly as has been described for the Levenson mask in the first embodiment.

The present embodiment's Levenson mask includes Cr film 41 having an eaves 51. Cr film 41 has first subopenings 31a-31d each in the form of a rectangle as seen in a plane. More than one first subopening 31 defined to expose an end of the dug portion are provided. π opening 11 is formed in a rectangle as seen in a plane and has four sides. In the present embodiment the first subopenings 31a-31d are formed to correspond to the four sides. The first subopenings 31a-31d are each arranged to have a longitudinal direction perpendicular to a side corresponding thereto, and allow the dug portion's end 21 to be observed therethrough.

Thus the π opening has a plurality of sides and a first subopening is provided to correspond to each of at least two of the plurality of sides. This allows an eaves to also be measured in size with high precision for sides of a recess that are etched in different directions, respectively. As a result a Levenson mask having an eaves with high precision can be provided.

The remainder in configuration, and function and effect is similar to that of the first embodiment.

Fifth Embodiment

Figure 12:
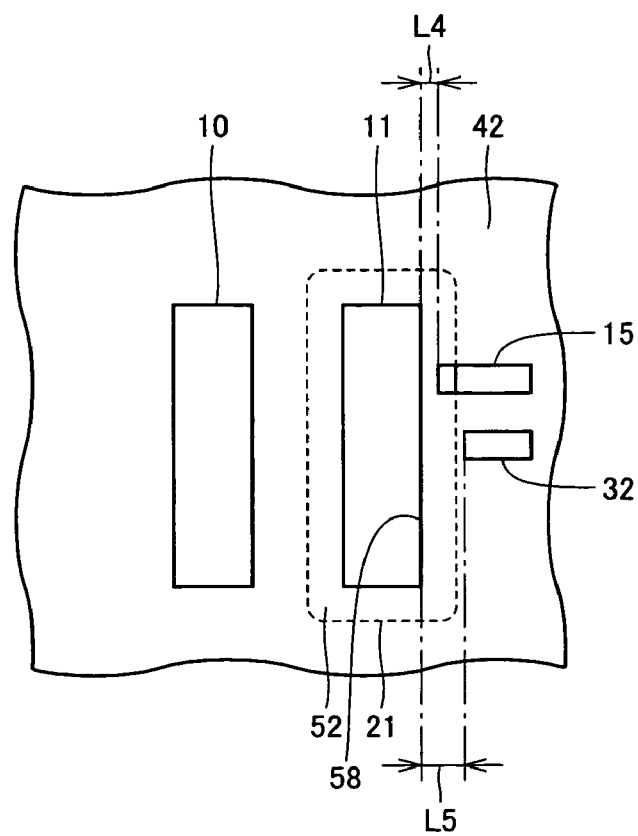
FIGS. 12 and 13 are plan views of first and second Levenson masks, respectively, in a fifth embodiment.
Figure 13:
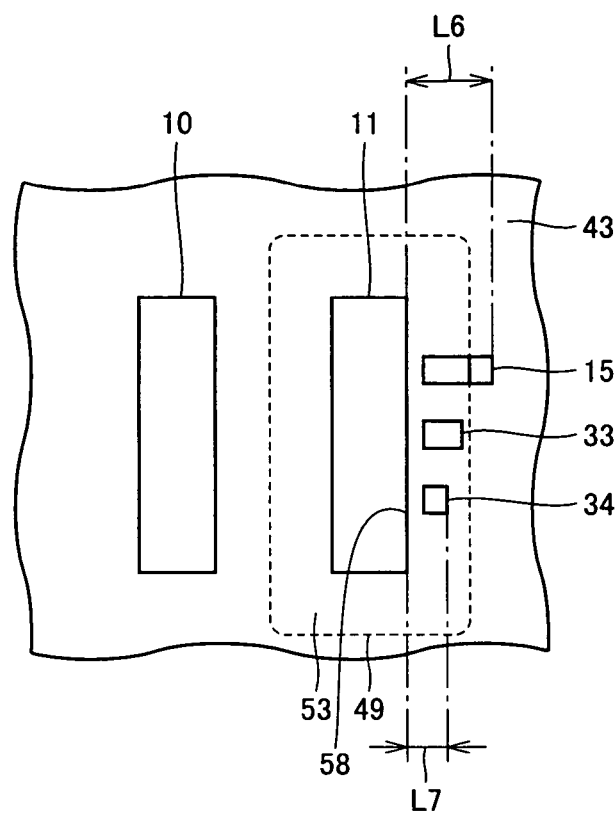

With reference to FIGS. 12 and 13, the present invention in a fifth embodiment provides a Levenson mask, as will be described hereinafter. FIG. 12 is a plan view of a first Levenson mask in the present embodiment.

A quartz substrate has a surface with a light shielding film implemented by a Cr film 42 deposited thereon and having 0 opening 10 and π opening 11, similarly as has been described in the first embodiment. The quartz substrate has a dug portion provided with an undercut, also similarly as has been described for the Levenson mask in the first embodiment.

The present embodiment's first Levenson mask includes Cr film 42 having an eaves 52. Cr film 42 has the first subopening 15 and a second subopening 32 each in the form of a rectangle as seen in a plane. The first and second subopenings 15 and 32 are aligned along a side 58 of π opening 11, and have a longitudinal direction substantially perpendicular to side 58.

In the present embodiment the second subopening 32 is defined to be different in longitudinal dimension from the first subopening 15. More specifically, the second subopening 32 is defined to have a longitudinal dimension smaller than the first subopening 15.

π opening 11 is spaced by a first distance L4 from that end of the first subopening 15 which is closer to π opening 11. π opening 11 is spaced by a second distance L5 larger than the first. distance L4 from that end of the second subopening 32 closer to π opening 11. Thus in the present embodiment π opening 11 is spaced from the first and second subopenings 15 and 32 by distance L4 and distance L5 larger than distance L4, respectively.

In the present embodiment the second subopening 32 exposes a main surface of the quartz substrate and does not expose the quartz substrate's dug portion. The first and second subopenings 15 and 32 are provided such that their respective ends farther from π opening 11 are substantially equally distant from π opening 11.

FIG. 13 is a plan view of a second Levenson mask in the present embodiment. The second Levenson mask includes a Cr film 43 having an eaves 53, and the first opening 15 and second openings 33 and 34 exposing a dug portion formed in a quartz substrate. More specifically, the second subopenings 33, 34 as seen in a plane are located within a region surrounded by an end 49 of the dug portion.

The first subopening 15 and the second subopenings 33 and 34 align along one side 58 of π opening 11. Between the first subopening 15 end farther from π opening and π opening 11 there is a distance L6, and between the second subopening 34 end farther from π opening 11 and π opening 11 there is a distance L7 different from distance L6. In the present embodiment distance L7 is smaller than distance L6. In the second Levenson mask the second subopening is located within a region provided with the dug portion.

Furthermore the first subopening 15 and the second subopenings 33, 34 as seen along side 58 have ends, respectively, farther from opening 11 that gradually approach π opening 11. The first subopening 15 is defined to have a longitudinal dimension larger than the second subopening 33, and the second subopening 33 is defined to have a longitudinal dimension larger than the second subopening 34.

The present embodiment's second Levenson mask has the first subopening 15 and the second subopenings 33, 34 such that their respective ends farther from π opening 11 are gradually offset by the same amount. In the present embodiment the first and second subopenings 15 and 33, respectively, have their respective ends offset to each other by 10 nm, and so do the second subopenings 33 and 34.

The remainder in configuration, and function and effect is similar to those described in the first and third embodiments.

Sixth Embodiment

Figure 14:
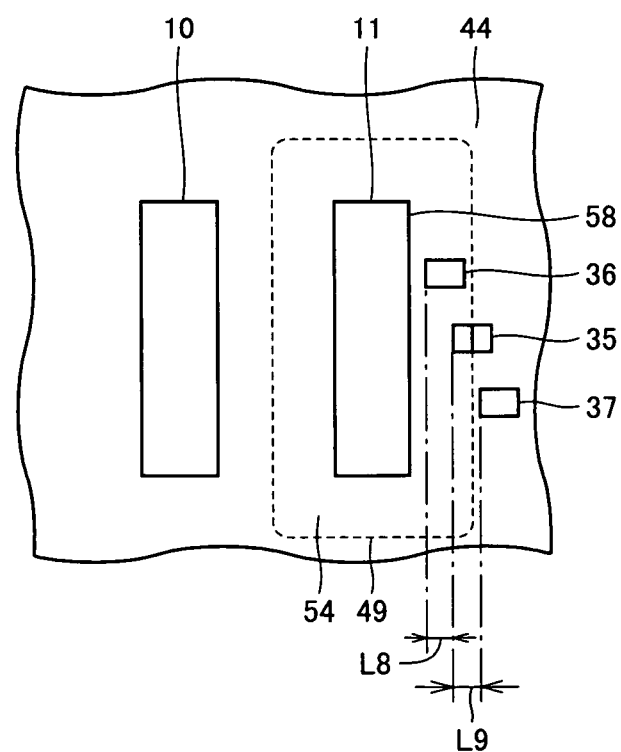
FIG. 14 is a plan view of a Levenson mask in a sixth embodiment.

With reference to FIG. 14, the present invention in a sixth embodiment provides a Levenson mask, as will be described hereinafter. FIG. 14 is a plan view of the Levenson mask in the present embodiment.

A quartz substrate has a surface with a light shielding film implemented by a Cr film 44 deposited thereon and having 0 opening 10 and π opening 11, similarly as has been described in the first embodiment. The quartz substrate has a dug portion provided with an undercut, also similarly as has been described in the first embodiment.

The present embodiment's Levenson mask includes Cr film 44 having an eaves 54. Cr film 44 has a first subopening 35 and second subopenings 36, 37. The first subopening 35 exposes the dug portion's end 49. The second subopening 36 exposes the dug portion. The second subopening 37 exposes the quartz substrate's main surface.

The first subopening 35 and the second subopenings 36, 37 are aligned along a side 58 in π opening 11. The side 58 is adjacent to the first subopening 35 and the second subopenings 36, 37. Furthermore in the present embodiment the first subopening 35 and the second subopenings 36, 37 are equal in length in a direction perpendicular to side 58. The first subopening 35 and the second subopenings 36,37 are defined to have their respective longitudinal dimensions equally. The first subopening 35 and the second subopenings 36, 37 are formed to be substantially identical in geometry as seen in a plane.

The first subopening 35 and the second subopening 36 are defined such that their respective ends closer to π opening 11 are gradually offset relative to side 58, and so are the first and second subopenings 35 and 37, respectively. These ends are mutually offset by amounts or lengths L8 and L9, which are substantially equal. In other words, as seen in a plane and along side 58, the subopenings recede from π opening 11 gradually by a constant length.

Similarly, the first subopening 35 and the second subopenings 36, 37 are defined such that their respective ends farther from π opening 11 recede from π opening 11 gradually by a constant length. Thus in the present embodiment the first and second subopenings are formed to be substantially identical in geometry as seen in a plane and are equally offset. In the present embodiment, the subopenings have their respective adjacent ends each offset by 10 nm.

The remainder in configuration, and function and effect is similar to those described in the first and third embodiments.

Seventh Embodiment

Figure 15:
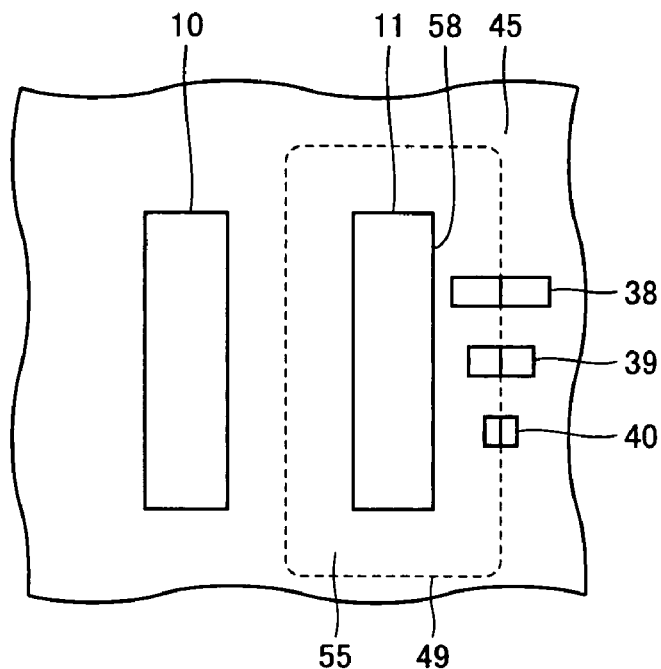
FIGS. 15, 16 and 17 are plan views of first, second and third Levenson masks, respectively, in a seventh embodiment.
Figure 16:
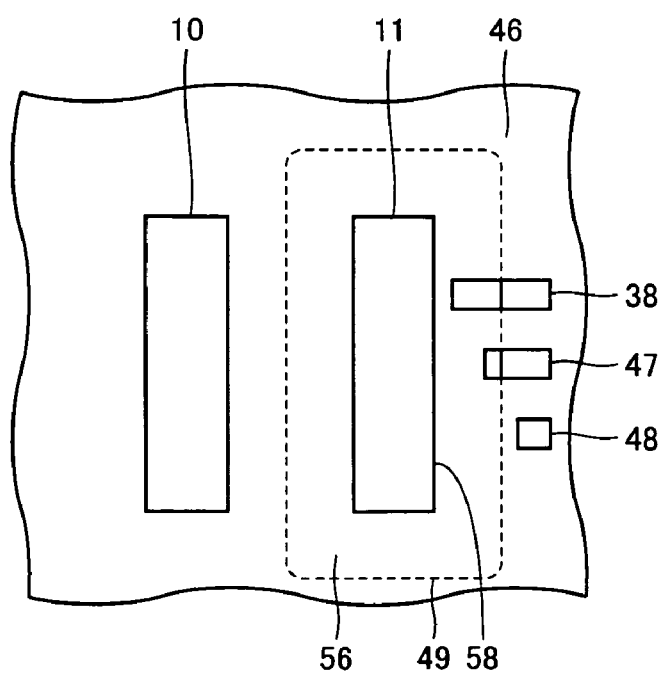
Figure 17:
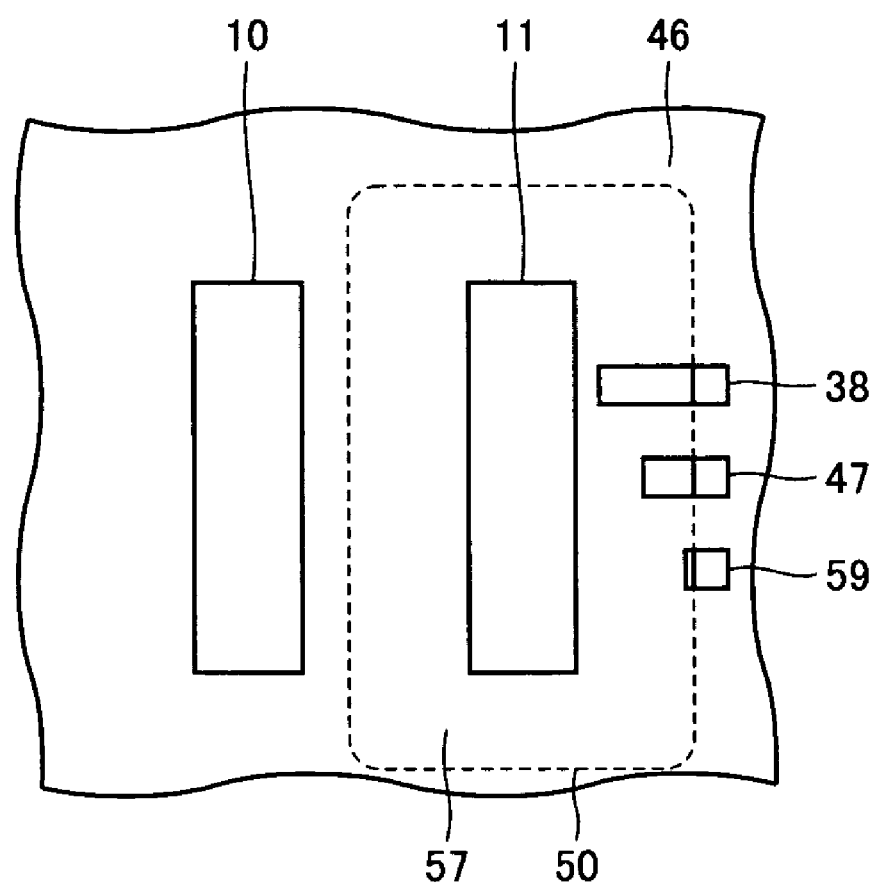

With reference to FIGS. 15-17 the present invention in a seventh embodiment provides a Levenson mask having a plurality of subopenings along one side of the π opening.

FIG. 15 is a plan view of a first Levenson mask in the present embodiment. A quartz substrate has a surface with a light shielding film implemented by a Cr film 45 deposited thereon and having 0 opening 10 and π opening 11, similarly as has been described in the first embodiment. The quartz substrate has a dug portion provided with an undercut, also similarly as has been described of the Levenson mask in the first embodiment.

The present embodiment's first Levenson mask includes Cr film 45 having a first subopening 38 and second subopenings 39, 40 each formed in a rectangle, as seen in a plane, and having a longitudinal direction perpendicular to side 58 of π opening 11. The first subopening 38 exposes the dug portion's end 49. The second subopenings 39, 40 each expose an end of the dug portion. Cr film 45 has an eaves 55.

The first subopening 38 and the second subopenings 39, 40 are defined such that their respective ends closer to π opening 11 and those farther from π opening 11 are mutually offset substantially equally in amount and gradually. In the present embodiment the first and second subopenings 38 and 39, respectively, have their respective ends offset by 10 nm and so do the second subopenings 39 and 40.

The first subopening 38 and the second subopenings 39 and 40 as seen along side 58 gradually reduce in longitudinal dimension. More specifically, in the longitudinal direction, the second subopening 39 is shorter than the first subopening 38, and the second subopening 40 is shorter than the second opening 39. In the present embodiment the first subopening 38 and the second subopenings 39, 40 have their respective longitudinal sides with their respective midlines aligned on a single straight line.

FIG. 16 is a plan view of a second Levenson mask in the present embodiment including a light shielding film implemented by a Cr film 46 having an eaves 56.

The present embodiment's second Levenson mask includes Cr film 46 having the first subopening 38 and second subopenings 47, 48 each formed in a rectangle, as seen in a plane, and having a longitudinal direction perpendicular to side 58 of π opening 11. The first and second subopenings 38 and 37, respectively, expose the dug portion's end 49, and the second subopening 48 exposes the substrate's main surface alone.

The first subopening 38 and the second subopenings 47, 48 as seen along side 58 gradually reduce in longitudinal dimension. Furthermore, the first subopening and the second subopenings 47, 48 are defined such that their respective ends closer to π opening 11, as seen along side 58, recede gradually by amounts, respectively, substantially equal in length. In contrast, the openings are defined such that their respective ends farther from π opening 11 are substantially equally distant from π opening 11.

FIG. 17 is a plan view of a third Levenson mask in the present embodiment. The third Levenson mask includes a Cr film similar to that of the second Levenson mask of the present embodiment, and the third Levenson mask's Cr film has a subopening similar to that of the second Levenson mask of the present embodiment. Cr film 46 has the first subopening 38 and second subopenings 47, 59 and includes an eaves 57. The first subopening 38 and the second subopenings 47, 59 are defined such that their respective ends closer to π opening 11 are mutually offset gradually and substantially by a constant amount.

In the present embodiment the third Levenson mask is distinguished from the second Levenson mask by a configuration of a dug portion formed in a quartz. substrate. The third Levenson mask includes a dug portion having an end 50 exposed through the first subopening 38 and the second subopenings 47, 59 defined in Cr film 46.

Note that in the present embodiment the second subopening exposes an end of a dug portion. When an eaves is formed in a process, whether the second subopening exposes the end depends on the amount of wet etching to form the eaves. As such, the second subopening may expose the quartz substrate's main surface alone, the dug portion alone, or both of them (i.e., the dug portion's end). Thus the present invention simply requires that at least one subopening expose an end of a dug portion.

The remainder in configuration, and function and effect is similar to those described in the first and third embodiments.

The present invention can thus provide a Levenson mask allowing an eaves's size to be directly measured, and a method of fabricating semiconductor device allowing microfabrication.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask comprising:
a substrate having a main surface with a portion provided with a recess; and
a shielding film deposited on said main surface, wherein:
said recess includes an undercut formed such that said shielding film partially serves an eaves;
said shielding film includes a first main opening exposing said portion of said recess, a second main opening exposing said main surface of said substrate, and a first subopening exposing a portion of an end of said recess underlying said first main opening;
said recess has said end formed to be geometrically substantially similar to said first main opening; and
said first main opening is located within a region provided with said recess;
first light, having passed through said first main opening, and second light, having passed through said second main opening are shifted in wavelength substantially by one half.

2. The phase shift mask according to claim 1, wherein:
said first main opening has one straight side substantially parallel to said end of said recess exposed through the first subopening.

3. The phase shift mask according to claim 2, wherein said one side of said first main opening and said end of said recess exposed through said first subopening are spaced by a distance larger than that between said one side of said first main opening and said first subopening's end closer to said first main opening and smaller than that between said one side of said first main opening and said first subopening's end farther from said first main opening.

4. The phase shift mask according to claim 1, wherein said first subopening is in communication with said first main opening.

5. The phase shift mask according to claim 1, wherein said first main opening and said first subopening are located outer than an exposure region employed to form a pattern on a wafer.

6. The phase shift mask according to claim 1, wherein more than one said first subopening are provided.

7. The phase shift mask according to claim 6, wherein:
said first main opening has a plurality of sides; and
said first subopening is provided to correspond to each of at least two of said plurality of sides.

8. The phase shift mask according to claim 1, wherein:
said shielding film has a second subopening;
said first and second subopenings are aligned along one side of said first main opening; and
said first and second subopenings as seen along said one side recede gradually farther away from said first main opening.

9. The phase shift mask according to claim 8, wherein:
said first and second subopenings have ends, respectively, defined at at least one of a location closer to said first main opening and that farther from said first main opening, and mutually offset relative to said one side of said first main opening; and
said first and second subopenings have said ends mutually offset by an amount substantially constant in length.

10. The phase shift mask according to claim 1, wherein:
said shielding film has a second subopening;
said first and second subopenings are aligned along one side of said first main opening; and
said second subopening is different in length from said first subopening in a direction substantially perpendicular to said one side of said first main opening.

11. The phase shift mask according to claim 10, wherein:
said first and second subopenings have ends, respectively, defined at at least one of a location closer to said first main opening and that farther from said first main opening, and mutually offset relative to said one side of said first main opening; and said first and second subopenings have said ends mutually offset by an amount substantially constant in length.

12. The phase shift mask according to claim 1, wherein:

said shielding film includes a second subopening;

said first and second subopenings are aligned along one side of said first main opening;

said first main opening and said first subopening's end closer to said first main opening are spaced by a first distance; and said first main opening and said second subopening's end closer to said first main opening are spaced by a second distance different from said first distance.

13. The phase shift mask according to claim 12, wherein:

said first and second subopenings have ends, respectively, defined at at least one of a location closer to said first main opening and that farther from said first main opening, and mutually offset relative to said one side of said first main opening; and said first and second subopenings have said ends mutually offset by an amount substantially constant in length.

14. The phase shift mask according to claim 1, wherein:

said shielding film includes a second subopening;

said first and second subopenings are aligned along one side of said first main opening;

said first subopening's end farther from said first main opening and said first main opening are spaced by a third distance; and said second subopening's end farther from said first main opening and said first main opening are spaced by a fourth distance different from said third distance.

15. The phase shift mask according to claim 14, wherein:

said first and second subopenings have ends, respectively, defined at at least one of a location closer to said first main opening and that farther from said first main opening, and mutually offset relative to said one side of said first main opening; and said first and second subopenings have said ends mutually offset by an amount substantially constant in length.

16. A phase shift mask comprising:

a substrate having a main surface with a portion provided with a recess; and a shielding film deposited on said main surface, wherein:

said recess has a depth allowing a light passing therethrough to be shifted by one half of a wavelength of said light;

said recess includes an undercut formed such that said shielding film partially serves an eaves;

said shielding film includes a first main opening exposing a portion of said recess, a second main opening exposing a main surface of said substrate, and a first subopening exposing a portion of an end of said recess underlying said first main opening;

said recess has said end formed to be geometrically substantially similar to said first main opening; and said first main opening is located within a region provided with said recess.

* * * * *